(12) United States Patent
Tsai et al.

(10) Patent No.: US 9,859,229 B2
(45) Date of Patent: Jan. 2, 2018

(54) PACKAGE STRUCTURE AND METHOD FOR FORMING THE SAME

(71) Applicant: Taiwan Semiconductor Manufacturing Co., Ltd., Hsinchu (TW)

(72) Inventors: Yu-Peng Tsai, Taipei (TW); Sheng-Feng Weng, Taichung (TW); Sheng-Hsiang Chiu, Tainan (TW); Meng-Tse Chen, Changzhi Township, Pingtung County (TW); Chih-Wei Lin, Zhubei (TW); Wei-Hung Lin, Xinfeng Township, Hsinchu County (TW); Ming-Da Cheng, Zhubei (TW); Ching-Hua Hsieh, Hsinchu (TW); Chung-Shi Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/227,060

(22) Filed: Aug. 3, 2016

(65) Prior Publication Data
US 2017/0317038 A1 Nov. 2, 2017

Related U.S. Application Data

(60) Provisional application No. 62/328,639, filed on Apr. 28, 2016.

(51) Int. Cl.
*H01L 25/065* (2006.01)
*H01L 23/552* (2006.01)
(Continued)

(52) U.S. Cl.
CPC .............. *H01L 23/60* (2013.01); *H01L 21/56* (2013.01); *H01L 23/3128* (2013.01);
(Continued)

(58) Field of Classification Search
CPC ........... H01L 2924/00; H01L 2924/181; H01L 2224/12105; H01L 24/19; H01L 21/568; H01L 2224/04105; H01L 2224/0401; H01L 23/49816; H01L 23/5389; H01L 21/561; H01L 23/3128
(Continued)

(56) References Cited

U.S. PATENT DOCUMENTS

| 8,361,842 B2 | 1/2013 | Yu et al. |
| 8,680,647 B2 | 3/2014 | Yu et al. |

(Continued)

*Primary Examiner* — Jonathan Han
(74) *Attorney, Agent, or Firm* — McClure, Qualey & Rodack, LLP

(57) ABSTRACT

Package structures and methods for forming the same are provided. The package structure includes an integrated circuit die and a first shielding feature over a base layer. The package structure also includes a package layer encapsulating the integrated circuit die and the first shielding feature. The package structure further includes a second shielding feature extending from the side surface of the base layer towards the first shielding feature to electrically connect to the first shielding feature. The side surface of the second shielding feature faces away from the side surface of the base layer and is substantially coplanar with the side surface of the package layer.

20 Claims, 15 Drawing Sheets

(51) Int. Cl.
    *H01L 25/00*  (2006.01)
    *H01L 23/60*  (2006.01)
    *H05K 9/00*  (2006.01)
    *H01L 23/538*  (2006.01)
    *H01L 23/31*  (2006.01)
    *H01L 21/56*  (2006.01)
(52) U.S. Cl.
    CPC ...... *H01L 23/5386* (2013.01); *H01L 23/5389* (2013.01); *H01L 25/0652* (2013.01); *H01L 25/50* (2013.01); *H05K 9/0073* (2013.01)
(58) Field of Classification Search
    USPC ................ 257/686, 777, E25.006, E25.013, 257/E25.018, E25.021, E25.027, E23.085, 257/E21.614, 685, 723, 726, 257/E25.031–E25.032, E23.042, 737, 257/E21.502, E23.068, 774, 678, 700, 257/758; 438/6, 28, 66, 67, 107, 109, 438/406, 455–459
    See application file for complete search history.

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,766,429 B2* | 7/2014 | Kim | H01L 23/552 257/659 |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 2009/0294941 A1* | 12/2009 | Oh | H01L 23/552 257/686 |
| 2011/0291288 A1 | 12/2011 | Wu et al. | |
| 2012/0228749 A1* | 9/2012 | Pagaila | H01L 23/147 257/659 |
| 2012/0241967 A1* | 9/2012 | Kim | H01L 23/552 257/773 |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0256847 A1* | 10/2013 | Park | H01L 23/585 257/659 |
| 2013/0264684 A1 | 10/2013 | Yu et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |

\* cited by examiner

PACKAGE STRUCTURE AND METHOD FOR FORMING THE SAME

CROSS REFERENCE TO RELATED APPLICATIONS

This Application claims the benefit of U.S. Provisional Application No. 62/328,639, filed on Apr. 28, 2016, and entitled "Package structure and method for forming the same", the entirety of which is incorporated by reference herein.

BACKGROUND

Semiconductor devices are used in a variety of electronic applications, such as personal computers, cell phones, digital cameras, and other electronic equipment. These semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that utilizes less area or a smaller height, in some applications.

New packaging technologies, such as package on package (PoP), have begun to be developed, in which a top package with a device die is bonded to a bottom package, with another device die. By adopting the new packaging technologies, various packages with different or similar functions are integrated together. These relatively new types of packaging technologies for semiconductor devices face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
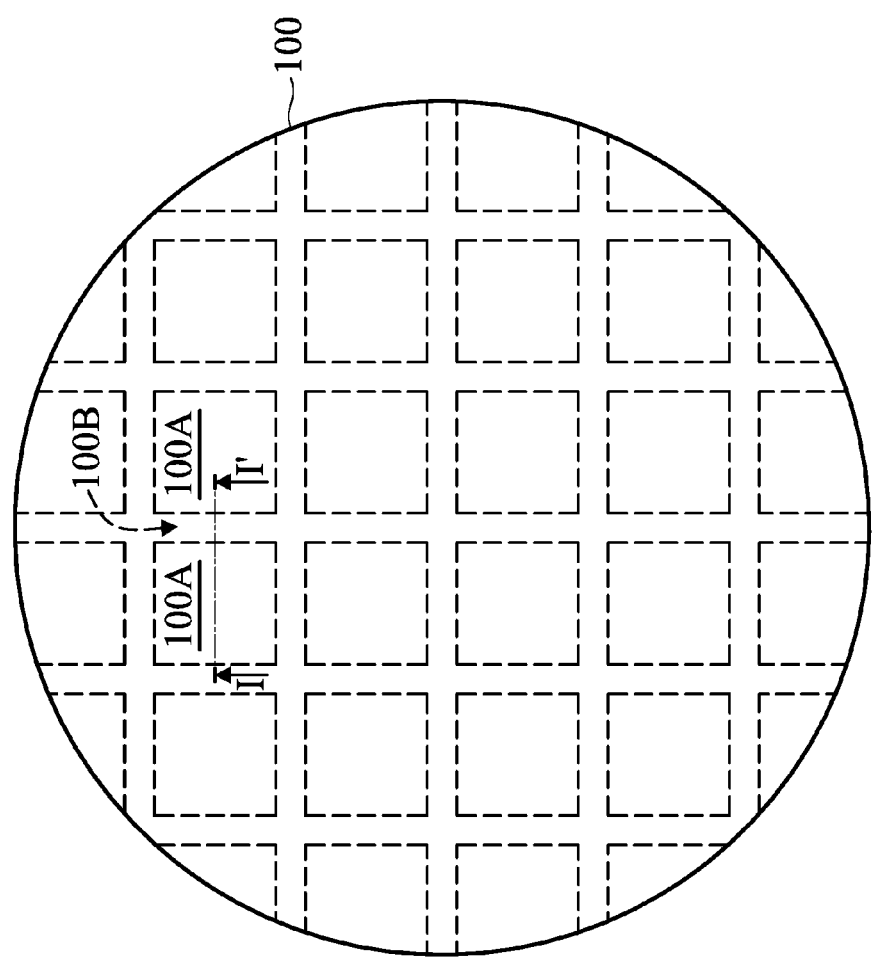
FIG. 1 is a top view of one of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments for a package structure and methods for forming the same are described. The package structure is applied to wafer level package (WLP).

FIG. 1 is a top view of one of various stages of a process for forming a package structure, in accordance with some embodiments. FIGS. 2A-2K are cross-sectional views of various stages of a process for forming a package structure, in accordance with some embodiments. In some embodiments, FIGS. 2A-2K are cross-sectional views taken along the line I-I' shown in FIG. 1.

Although some embodiments are discussed with operations performed in a particular order, these operations may be performed in another logical order. Additional operations can be provided before, during, and/or after the stages described in FIG. 1 and FIGS. 2A-2K. Some of the stages that are described can be replaced or eliminated for different embodiments. Additional features can be added to the package structure. Some of the features described below can be replaced or eliminated for different embodiments.

As shown in FIG. 1, a carrier substrate 100 is provided, in accordance with some embodiments. In some embodiments, the carrier substrate 100 is used as a temporary substrate. The temporary substrate provides mechanical and structural support during subsequent processing steps, such as those described in more detail later. The carrier substrate 100 is made of a semiconductor material, ceramic material, polymer material, metal material, another suitable material, or a combination thereof. In some embodiments, the carrier substrate 100 is a glass substrate. In some other embodiments, the carrier substrate 100 is a semiconductor substrate, such as a silicon wafer.

As shown in FIG. 1, multiple regions 100A and a region 100B are defined on the carrier substrate 100, in accordance with some embodiments. The region 100B separates the regions 100A from one another. A package structure, which will be described in more detail later, is configured to be formed in each of the regions 100A. The region 100B includes a scribe line that isolates the package structures being formed in the regions 100A from one another.

Figure 2A:
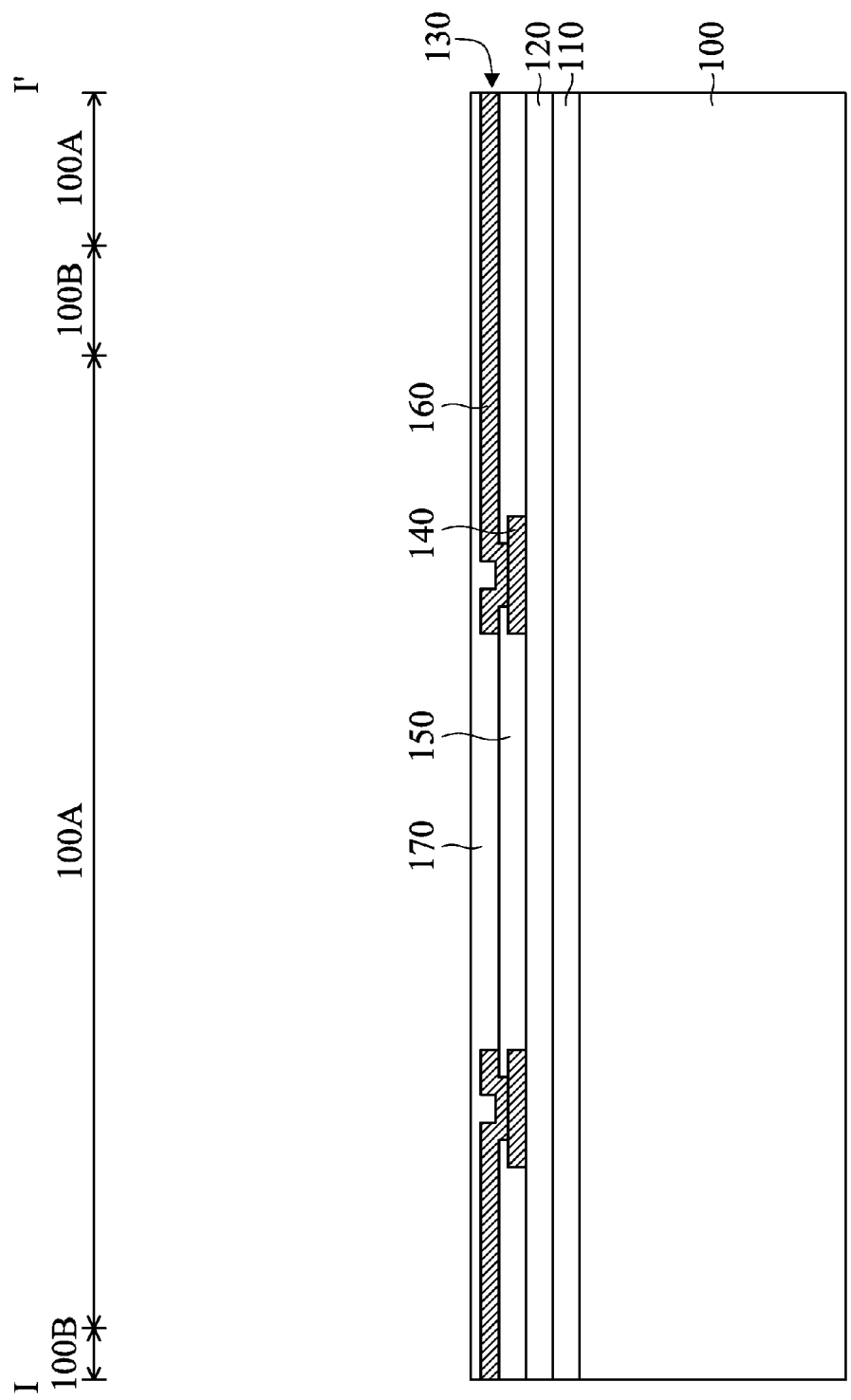
FIGS. 2A-2K are cross-sectional views of various stages of a process for forming a package structure, in accordance with some embodiments.

As shown in FIG. 2A, an adhesive layer 110 is deposited over the carrier substrate 100 in the regions 100A and the region 100B, in accordance with some embodiments. The adhesive layer 110 may be made of glue, or may be a lamination material, such as a foil. In some embodiments, the adhesive layer 110 is photosensitive and is easily detached from the carrier substrate 100 by light irradiation. For example, shining ultra-violet (UV) light or laser light on the carrier substrate 100 is used to detach the adhesive layer 110. In some embodiments, the adhesive layer 110 is a light-to-heat-conversion (LTHC) coating. In some other embodiments, the adhesive layer 110 is heat-sensitive and is easily detached from the carrier substrate 100 when it is exposed to heat.

Subsequently, a base layer 120 is deposited or laminated over the adhesive layer 110 in the regions 100A and the region 100B, in accordance with some embodiments. The base layer 120 provides structural support for bonding an integrated circuit die, which will be described in more detail later, and helps reduce die shifting issues. In some embodiments, the base layer 120 is a polymer layer or a polymer-containing layer. The base layer 120 is a poly-p-phenylen-ebenzobisthiazole (PBO) layer, a polyimide (PI) layer, a solder resist (SR) layer, an Ajinomoto buildup film (ABF), a die attach film (DAF), another suitable layer, or a combination thereof.

Afterwards, a redistribution structure 130 is formed over the base layer 120, in accordance with some embodiments. The redistribution structure 130 includes one or more conductive layers and one or more passivation layers. For example, the redistribution structure 130 includes conductive layers 140 and 160, and passivation layers 150 and 170.

In some embodiments, the conductive layer 140 is formed over the base layer 120 in the regions 100A. In some other embodiments, the conductive layer 140 is formed over the base layer 120 in the regions 100A and the region 100B. The passivation layer 150 is deposited over the base layer 120 in the regions 100A and the region 100B, and partially covers the conductive layer 140. Portions of the conductive layer 140 are exposed from openings in the passivation layer 150.

The conductive layer 160 is formed over the passivation layer 150 in the regions 100A and the region 100B. The conductive layer 160 is electrically connected to the conductive layer 140 through the openings in the passivation layer 150. The passivation layer 170 is deposited over the passivation layer 150 in the regions 100A and the region 100B, and covers the conductive layer 160.

In some embodiments, the conductive layer in the redistribution structure 130 is made of metal materials. The metal material includes copper (Cu), Cu alloy, aluminum (Al), Al alloy, tungsten (W), W alloy, titanium (Ti), Ti alloy, tantalum (Ta), Ta alloy, another suitable material, or a combination thereof. In some embodiments, the conductive layer in the redistribution structure 130 is formed by an electroplating process, an electroless plating process, a sputtering process, a chemical vapor deposition (CVD) process, or another applicable process.

In some embodiments, the passivation layer in the redistribution structure 130 is made of polybenzoxazole (PBO), benzocyclobutene (BCB), silicone, acrylates, siloxane, another suitable material, or a combination thereof. In some other embodiments, the passivation layer in the redistribution structure 130 is made of non-organic materials. The non-organic materials includes silicon oxide, un-doped silicate glass, silicon oxynitride, solder resist (SR), silicon nitride, silicon carbide, hexamethyldisilazane (HMDS), another suitable material, or a combination thereof. Multiple deposition, coating, and/or etching processes may be used to form the redistribution structure 130.

Figure 2B:
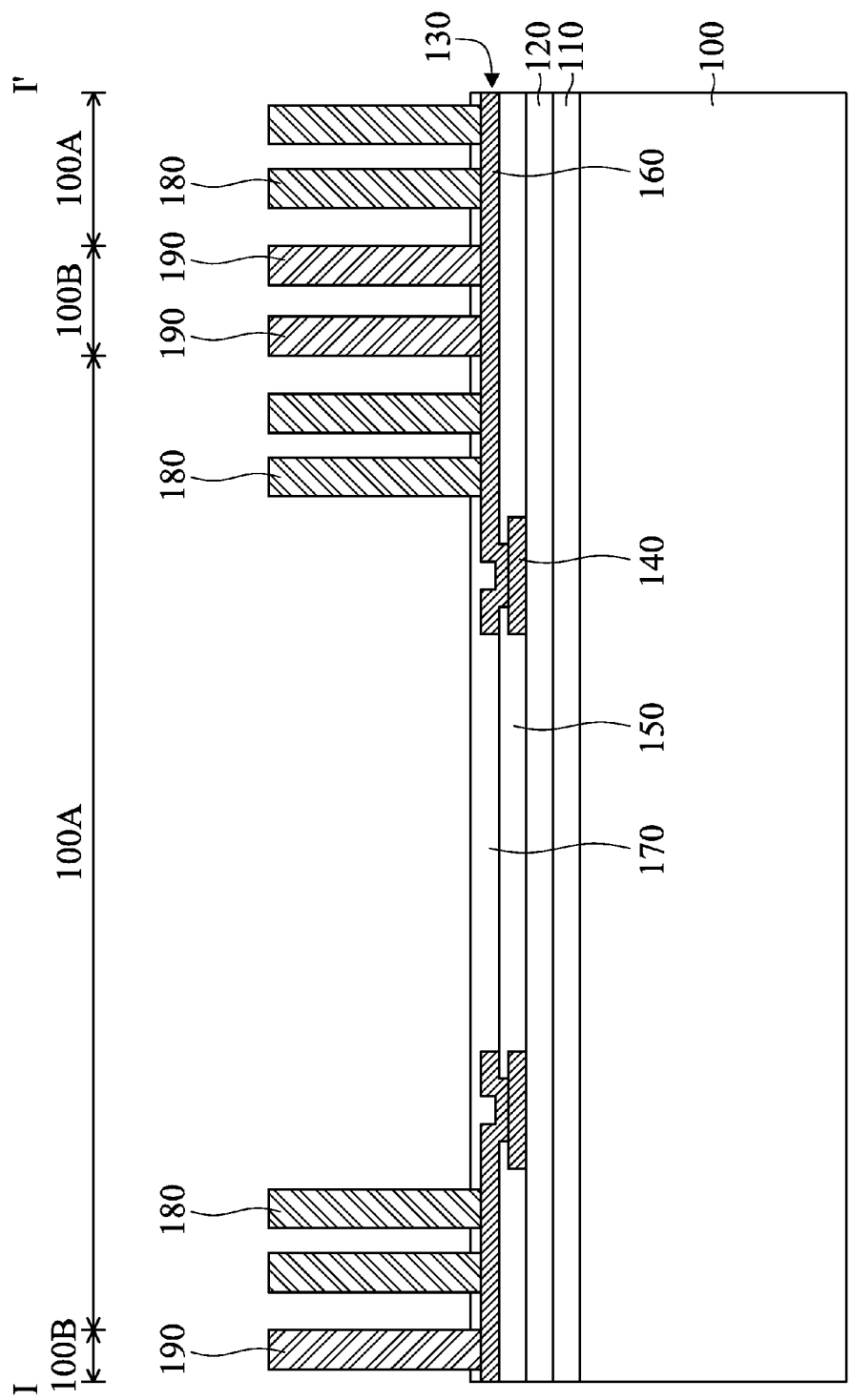

As shown in FIG. 2B, multiple conductive features 180 are formed over the redistribution structure 130 in the regions 100A, in accordance with some embodiments. In some embodiments, the conductive features 180 are conductive pillars or other suitable structures. The conductive features 180 may be referred to as through interposer vias (TIVs). The conductive features 180 are physically and electrically connected to one of the conductive layers in the redistribution structure 130. For example, the passivation layer 170 has openings that partially expose the conductive layer 160. The conductive features 180 fill some of the openings in the passivation layer 170 and electrically connect to the conductive layer 160.

In some embodiments, the conductive features 180 include Cu, Al, nickel (Ni), platinum (Pt), lead-free solder (e.g., SnAg, SnCu, SnAgCu), another suitable conductive material, or a combination thereof. In some embodiments, the conductive features 180 are formed using an electroplating process, a physical vapor deposition (PVD) process, a CVD process, an electrochemical deposition (ECD) process, a molecular beam epitaxy (MBE) process, an atomic layer deposition (ALD) process, or another applicable process.

As shown in FIG. 2B, multiple shielding features 190 are formed over the redistribution structure 130 in the region 100B, in accordance with some embodiments. In some embodiments, the shielding features 190 are pillars, walls or other suitable structures. In some embodiments, the shielding features 190 may be referred to as TIVs.

The shielding features 190 in the region 100B are electrically connected to the conductive features 180 in the regions 100A through the redistribution structure 130. The shielding features 190 are physically and electrically connected to one of the conductive layers in the redistribution structure 130. For example, the shielding features 190 fill some of the openings in the passivation layer 170 and electrically connect to the conductive layer 160. In some embodiments, the thickness or height of the shielding features 190 is substantially the same as that of the conductive features 180.

In some embodiments, the shielding features 190 include Cu, Al, Ni, Pt, lead-free solder, another suitable conductive material, or a combination thereof. In some embodiments, the conductive features 180 and the shielding features 190 are made of the same material. However, embodiments of the disclosure are not limited thereto. In some other embodiments, the conductive features 180 and the shielding features 190 are made of different materials.

In some embodiments, the shielding features 190 are formed using an electroplating process, a PVD process, a CVD process, an ECD process, an MBE process, an ALD process, or another applicable process. In some embodiments, the conductive features 180 and the shielding features 190 are formed in the same stage using the same process. For example, a mask layer (not shown) is formed over the redistribution structure 130. The mask layer has openings in the regions 100A and the region 100B. The openings in the regions 100A define the positions where the conductive features 180 are designed to be formed. The openings in the region 100B define the positions where the shielding features 190 are designed to be formed. A conductive material is deposited to completely or partially fill the openings in the mask layer. Afterwards, the mask layer is removed, and the deposited conductive material forms the conductive features 180 and the shielding features 190, as shown in FIG. 2B.

However, embodiments of the disclosure are not limited thereto. In some other embodiments, the shielding features 190 are formed before or after the formation of the conductive features 180.

Figure 3:
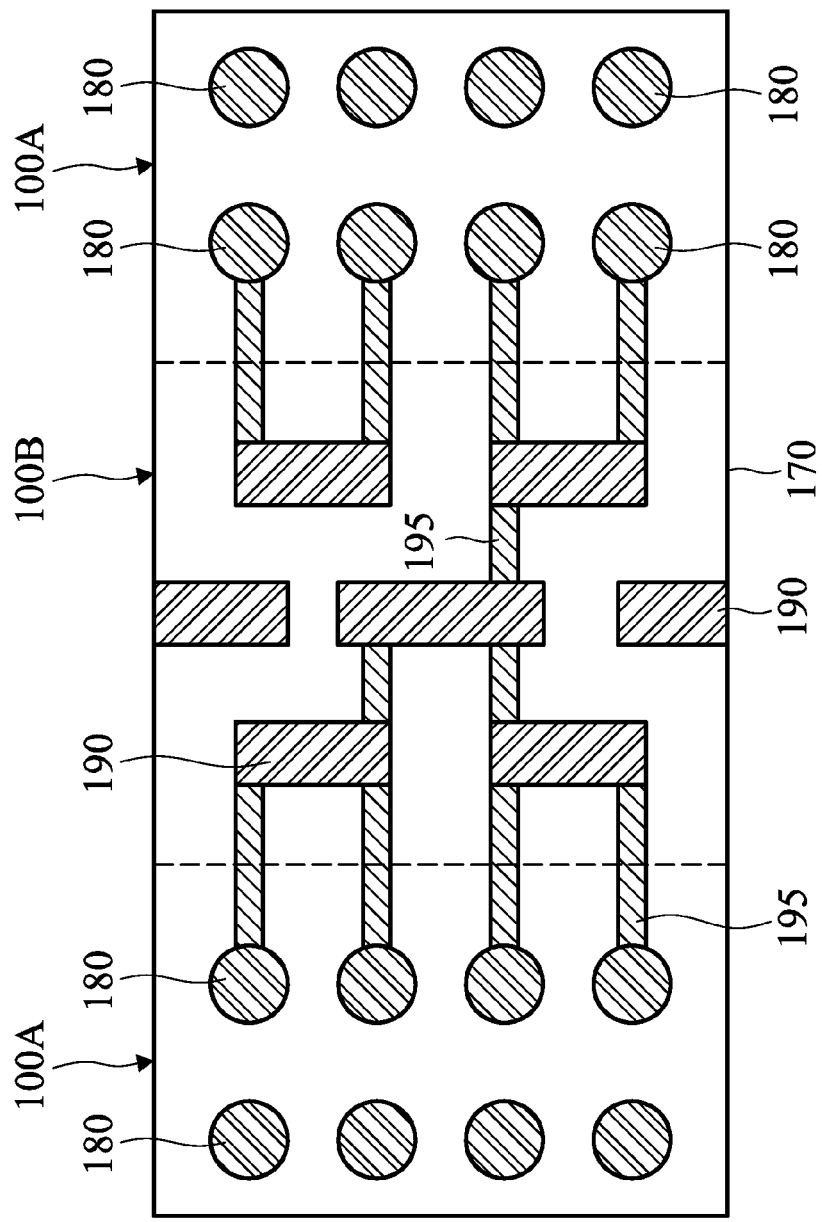
FIG. 3 is a top view of one of various stages of a process for forming a package structure, in accordance with some embodiments.

Referring to FIG. 3, a top view of the conductive features 180 and the shielding features 190, in accordance with some embodiments, is illustrated. As shown in FIG. 3, the conductive features 180 and the shielding features 190 are over the passivation layer 170 of the redistribution structure 130. In some embodiments, the conductive features 180 are arranged in one or more tiers along boundaries of the regions 100A. In some embodiments, there is one or more shielding features 190 positioned laterally between two adjacent the regions 100A. In some embodiments, the shielding features 190 are arranged in one or more tiers in the region 100B.

In some embodiments, one of the shielding features 190 laterally overlaps one or more of the conductive features 180. In some embodiments, the combination of all the shielding features 190 substantially laterally overlaps all the conductive features 180. In some embodiments, all the conductive features 180 are substantially laterally enclosed by the combination of all the shielding features 190. In other words, all the shielding features 190 in the region 100B together construct a wall surrounding the boundaries of the regions 100A. Although the wall constructed by the shielding features 190 shown in FIG. 3 is laterally discontinuous, embodiments of the disclosure are not limited thereto. In some other embodiments, the wall constructed by the shielding features 190 is laterally continuous.

Although one of the conductive features 180 and one of the shielding features 190 shown in FIG. 3 have different sizes, embodiments of the disclosure are not limited thereto. In some other embodiments, one of the conductive features 180 and one of the shielding features 190 are the same size.

The top-view profile of the conductive features 180 or the shielding features 190 may be circular, circle-like, oval, rectangular, square, or another suitable shape. In some embodiments, one of the conductive features 180 and one of the shielding features 190 have different top-view profiles. For example, the top-view profile of the conductive features 180 is substantially circular while the top-view profile of the shielding features 190 is rectangular. However, embodiments of the disclosure are not limited thereto. In some other embodiments, one of the conductive features 180 and one of the shielding features 190 have the same top-view profile.

As shown in FIG. 3, multiple connecting features 195 are formed over the passivation layer 170 of the redistribution structure 130, in accordance with some embodiments. In some embodiments, there is one or more connecting features 195 laterally extending across the boundary between one of the regions 100A and the region 100B. In some embodiments, the connecting features 195 continuously extend from the regions 100A into the region 100B.

In some embodiments, one of the connecting features 195 is between one of the shielding features 190 and one of the conductive features 180. In some embodiments, one of the connecting features 195 is between two of the shielding features 190. In some embodiments, there is no connecting feature 195 between two of the shielding features 190.

The conductive features 180 in the regions 100A are electrically connected to the shielding features 190 in the region 100B through the connecting features 195. In some embodiments, one of the connecting features 195 is physically and electrically connected to one or more of the conductive features 180. In some embodiments, one of the connecting features 195 is physically and electrically connected to one or more of the shielding features 190. In some embodiments, the thickness or height of the connecting features 195 is substantially the same as that of the conductive features 180 and/or the shielding features 190.

In some embodiments, the connecting features 195 include Cu, Al, Ni, Pt, lead-free solder, another suitable conductive material, or a combination thereof. In some embodiments, the connecting features 195 are formed using an electroplating process, a PVD process, a CVD process, an ECD process, an MBE process, an ALD process, or another applicable process. In some embodiments, the connecting features 195, the conductive features 180 and the shielding features 190 are formed in the same stage using the same process.

Many variations and/or modifications can be made to embodiments of the disclosure. In some other embodiments, the connecting features 195 are not formed. The conductive features 180 in the regions 100A are electrically connected to the shielding features 190 in the region 100B through the redistribution structure 130.

Figure 4:
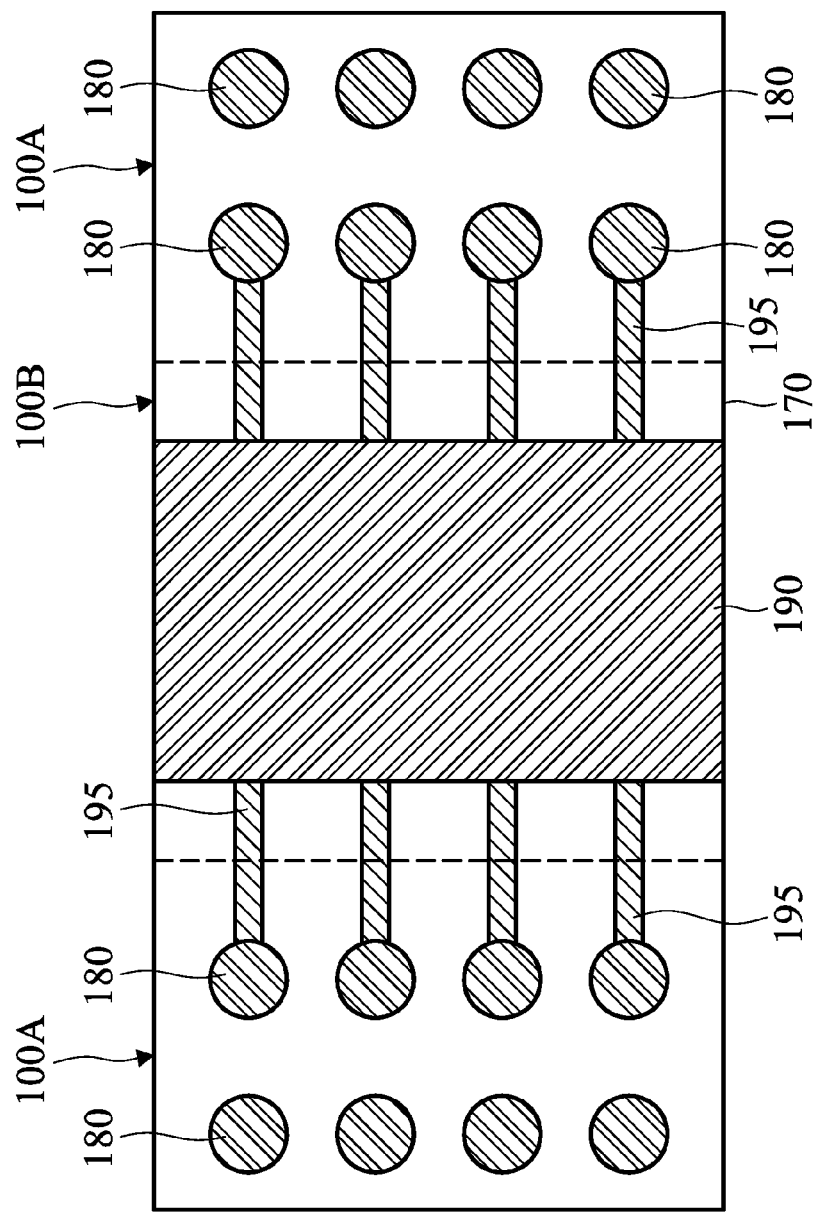
FIG. 4 is a top view of one of various stages of a process for forming a package structure, in accordance with some embodiments.

FIG. 4 is a top view of one of various stages of a process for forming a package structure, in accordance with some embodiments. A structure similar to that shown in FIG. 3 is illustrated. As shown in FIG. 4, there is one shielding feature 190 laterally between two adjacent the regions 100A. The size of the shielding feature 190 is greater than that of one of the conductive features 180. The top-view profile of the shielding feature 190 is different from that of the conductive features 180.

In some embodiments, the shielding feature 190 in the region 100B continuously surrounds the regions 100A. In some embodiments, the shielding feature 190 substantially laterally overlaps all the conductive features 180. In some embodiments, all the conductive features 180 are substantially laterally encircled by the shielding feature 190.

As shown in FIG. 4, the shielding feature 190 is electrically connected to the conductive features 180 through multiple connecting features 195, in accordance with some embodiments. Embodiments of the disclosure are not limited thereto. In some other embodiments, the shielding feature 190 is electrically connected to the conductive features 180 in one of the regions 100A through one connecting feature 195.

FIGS. 3 and 4 show some examples of the patterns of the conductive features 180, the shielding features 190, and the connecting features 195. However, they are not limitations of the disclosure. The patterns of the conductive features 180, the shielding features 190, and the connecting features 195 can be adjusted according to requirements.

Figure 2C:
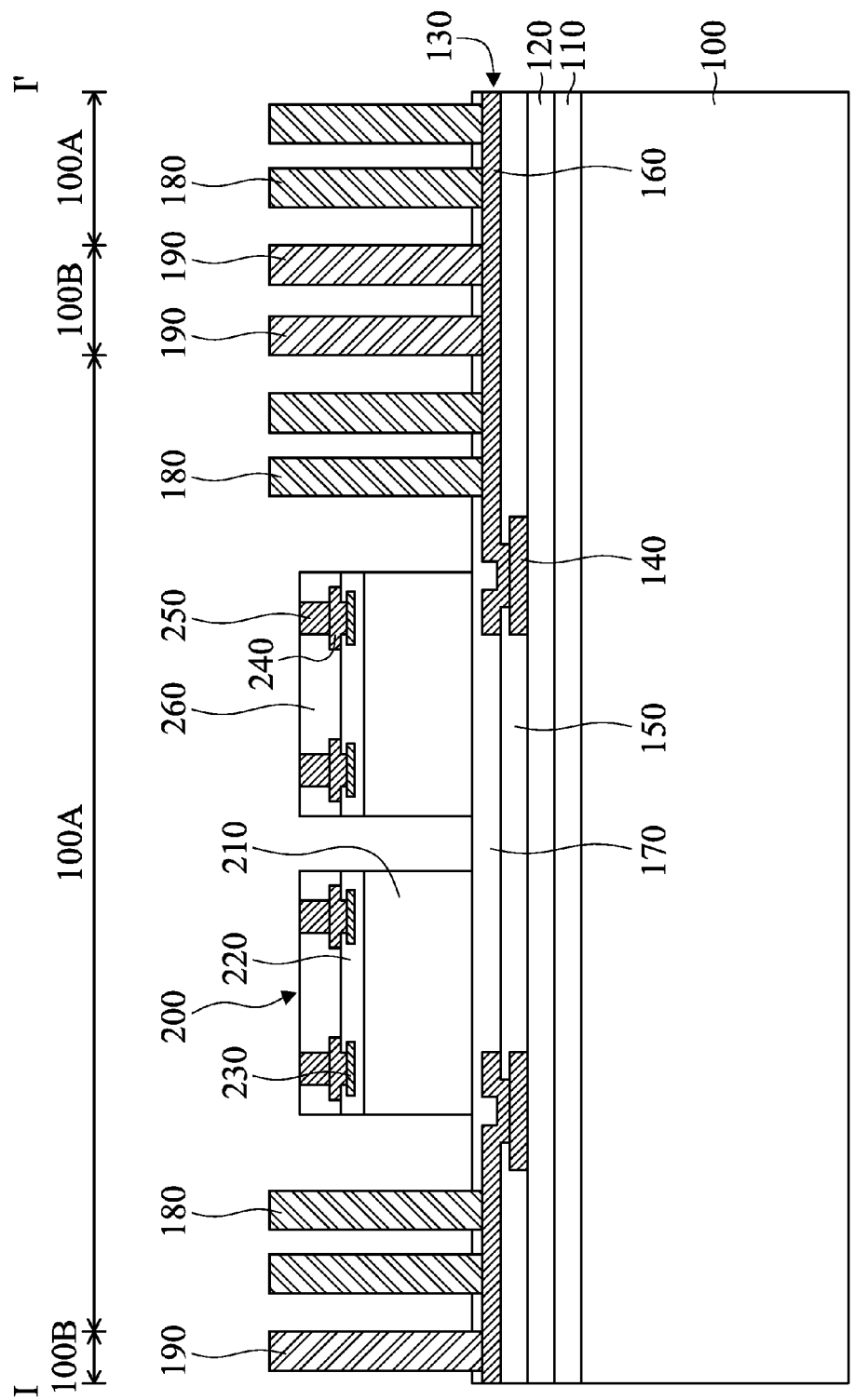

Afterwards, multiple integrated circuit dies 200 are disposed on the redistribution structure 130 in one or more of the regions 100A, as shown in FIG. 2C in accordance with some embodiments. In some embodiments, the front side (the active surface) of the integrated circuit dies 200 faces away from the redistribution structure 130. The back side (the non-active surface) of the integrated circuit dies 200 faces the redistribution structure 130. In some embodiments, an adhesive film, such as a DAF (not shown), is used to bond or attach the integrated circuit dies 200 and the redistribution structure 130.

The integrated circuit dies 200 may be device dies including transistors, diodes, or another suitable integrated circuit element. The device dies may also include capacitors, inductors, resistors, another integrated circuit element, or a combination thereof. In some embodiments, the integrated circuit dies 200 are logic dies, central processing unit (CPU) dies, memory dies, or another suitable dies.

Each of the integrated circuit dies 200 may include a semiconductor substrate 210, a passivation layer 220, conductive pads 230, connectors 240 and 250, and a protection layer 260. A variety of device elements may be formed in or over the semiconductor substrate 210. The device elements include active devices and/or passive devices. The device elements may include logic devices, central processing unit (CPU) dies, memory devices, image sensor devices, or other applicable types of devices.

Although FIG. 2C shows that there are multiple integrated circuit dies 200 in one of the regions 100A, embodiments of the disclosure are not limited thereto. In some other embodiments, there is one integrated circuit die 200 in one of the regions 100A.

In some embodiments, the conductive features 180 are on two opposite sides of the integrated circuit dies 200. In some other embodiments, the conductive features 180 discontinuously surround the integrated circuit dies 200. The conductive features 180 are between the integrated circuit dies 200 and the shielding features 190. In some embodiments, the shielding features 190 discontinuously surround the integrated circuit dies 200. In some other embodiments, the shielding features 190 continuously surround the integrated circuit dies 200.

Figure 2D:
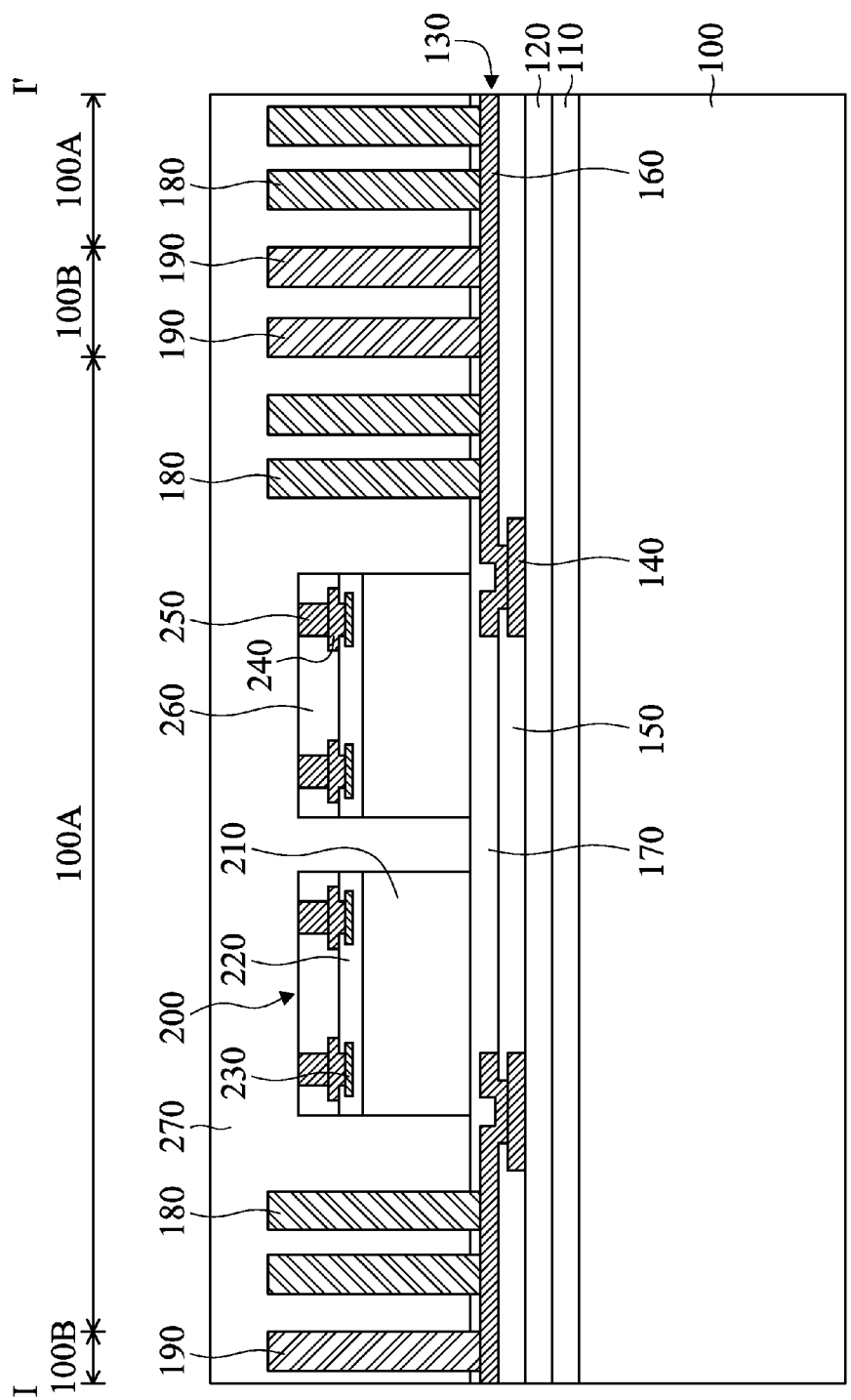

As shown in FIG. 2D, a package layer 270 is deposited over the redistribution structure 130 in the regions 100A and the region 100B, in accordance with some embodiments. The deposited package layer 270 covers the top surfaces of the conductive features 180, the shielding features 190, and the integrated circuit dies 200.

In some embodiments, the package layer 270 includes a polymer material. In some embodiments, the package layer 270 includes a molding compound. In some embodiments, a liquid molding compound material is applied over the redistribution structure 130. In some embodiments, a thermal process is then performed to harden the molding compound material and to transform it into the package layer 270. As a result, the conductive features 180, the shielding features 190, the connecting features 195, and the integrated circuit dies 200 are encapsulated by the deposited package layer 270.

As mentioned above, in some embodiments, there is no connecting feature 195 between two of the shielding features 190. As a result, there are one or more empty paths between the shielding features 190, such as those shown in FIG. 3. Accordingly, it is easier for the liquid molding compound material to successfully encapsulate the conductive features 180, the shielding features 190, and the integrated circuit dies 200.

Figure 2E:
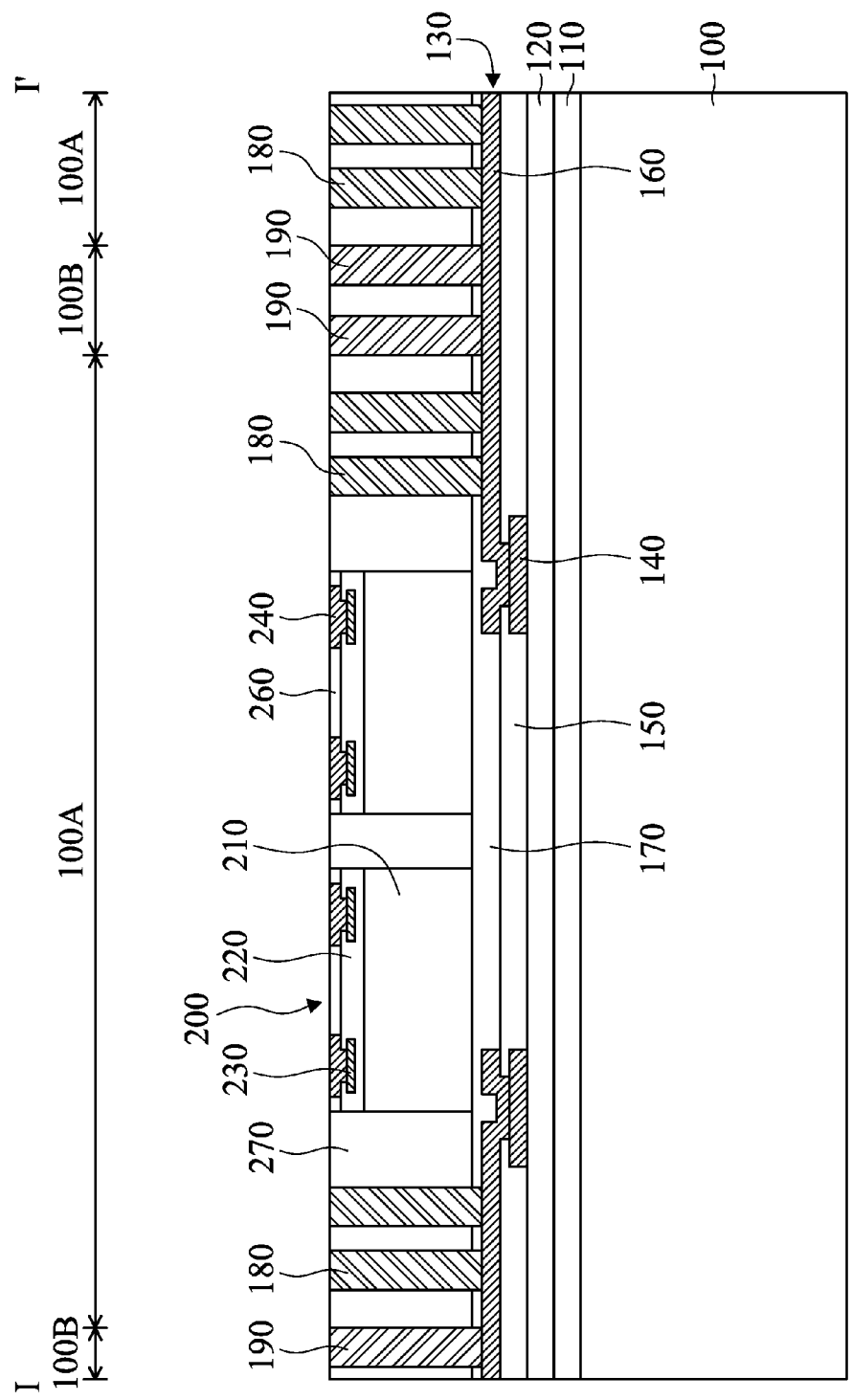

As shown in FIG. 2E, the deposited package layer 270 is thinned, in accordance with some embodiments. As a result, the conductive features 180, the shielding features 190, and the integrated circuit dies 200 are exposed. A planarization process may be used to thin the deposited package layer 270. The planarization process includes a grinding process, a chemical mechanical polishing (CMP) process, an etching process, another applicable process, or a combination thereof.

In some embodiments, the connectors 250 of the integrated circuit dies 200 are completely or partially removed during the planarization process. In some embodiments, the connectors 240 of the integrated circuit dies 200 are exposed. In some embodiments, upper portions of the conductive features 180 and the shielding features 190 are removed during the planarization process. In some embodiments, upper portions of the connecting feature 195 are removed during the planarization process. In some embodiments, the top surfaces of the thinned package layer 270, the conductive features 180, the shielding features 190, and the connectors 240 or 250 are substantially coplanar.

Figure 2F:
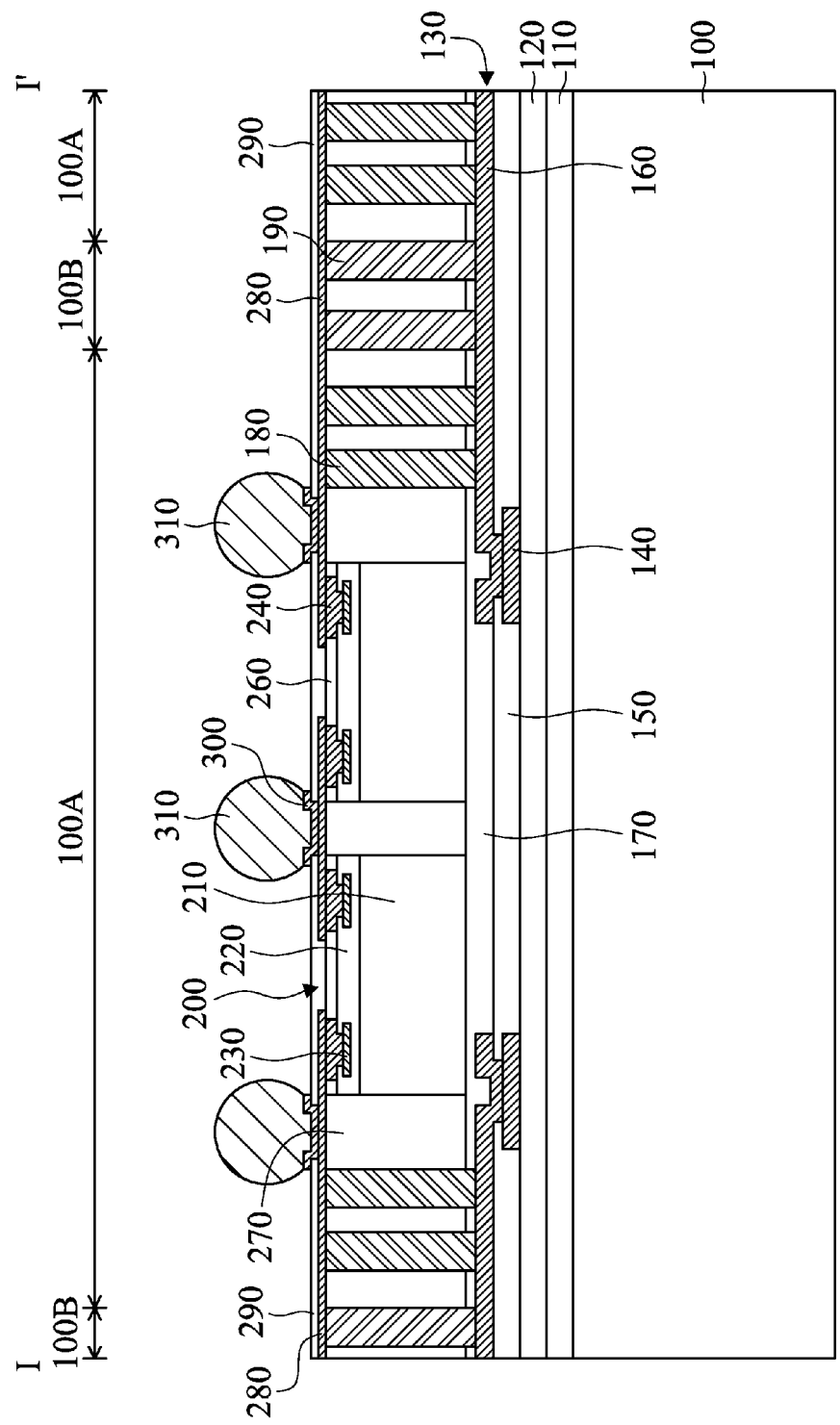

As shown in FIG. 2F, a redistribution structure including a conductive layer 280 and a passivation layer 290 is formed over the thinned package layer 270, in accordance with some embodiments. The redistribution structure over the thinned package layer 270 may include multiple conductive layers and passivation layers.

The conductive features 180, the shielding features 190, and the integrated circuit dies 200 are electrically connected to one another through the conductive layer 280. In some embodiments, the conductive layer 280 is formed over the package layer 270 in the regions 100A and the region 100B. The conductive layer 280 physically connects the conductive features 180 and the shielding features 190. In some other embodiments, the conductive layer 280 is formed in the regions 100A without extending into the region 100B. As a result, the conductive layer 280 does not physically connect the shielding features 190.

In some embodiments, the conductive layer 280 is made of a metal material. The metal material includes Cu, Cu alloy, Al, Al alloy, W, W alloy, Ti, Ti alloy, Ta, Ta alloy, another suitable material, or a combination thereof. In some embodiments, the conductive layer 280 is formed by an electroplating process, an electroless plating process, a sputtering process, a CVD process, or another applicable process.

The passivation layer 290 is deposited over the package layer 270 in the regions 100A and the region 100B, and partially covers the conductive layer 280. The passivation layer 290 has openings exposing portions of the conductive layer 280.

The passivation layer 290 is made of dielectric material(s) and provides stress relief for bonding stress incurred during subsequent bonding processes. In some embodiments, the passivation layer 290 is made of PBO, BCB, silicone, acrylates, siloxane, another suitable material, or a combination thereof. In some other embodiments, the passivation layer 290 is made of non-organic materials. The non-organic materials includes silicon oxide, un-doped silicate glass, silicon oxynitride, SR, silicon nitride, silicon carbide, HMDS, another suitable material, or a combination thereof. Multiple deposition, coating, and/or etching processes may be used to form the redistribution structure including the conductive layer 280 and the passivation layer 290.

As shown in FIG. 2F, multiple connectors 310 are formed over the passivation layer 290 in the regions 100A, in accordance with some embodiments. The connectors 310 may be mounted on (or bonded to) the redistribution structure through the openings in the passivation layer 290. Some of the connectors 310 are electrically connected to one of the integrated circuit dies 200 through the conductive layer 280. Some of the connectors 310 are electrically connected to other elements through the conductive layer 280 and one of the conductive features 180. The connectors 310 include solder bumps or other suitable connectors.

As shown in FIG. 2F, an under bump metallurgy (UBM) structure 300 is formed in one of the openings in the passivation layer 290, in accordance with some embodiments. The UBM structure 300 is between one of the connectors 310 and the exposed conductive layer 280. The UBM structure 300 may include a bond pad and one or more UBM layers over the exposed conductive layer 280. In some other embodiments, the UBM structure 300 is not formed.

Figure 2G:
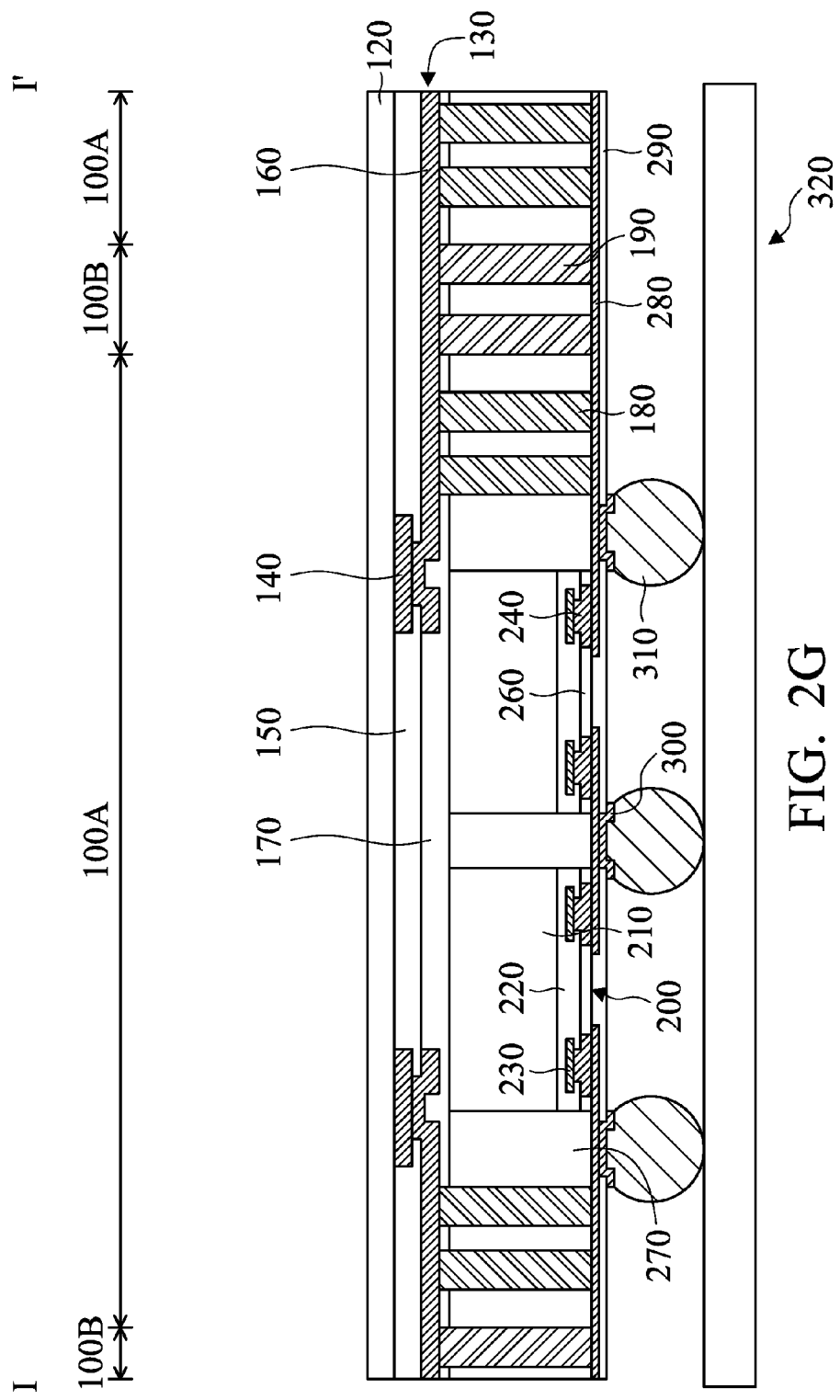

As shown in FIG. 2G, the structure as shown in FIG. 2F is flipped and attached to a carrier 320, in accordance with some embodiments. The carrier 320 includes a tape which is photosensitive or heat-sensitive and is easily detached from the connectors 310.

Afterwards, the carrier substrate 100 is removed. In some embodiments, both the carrier substrate 100 and the adhesive layer 110 are removed. Suitable light may be provided to remove the adhesive layer 110 so as to remove the carrier substrate 100 as well.

Figure 2H:
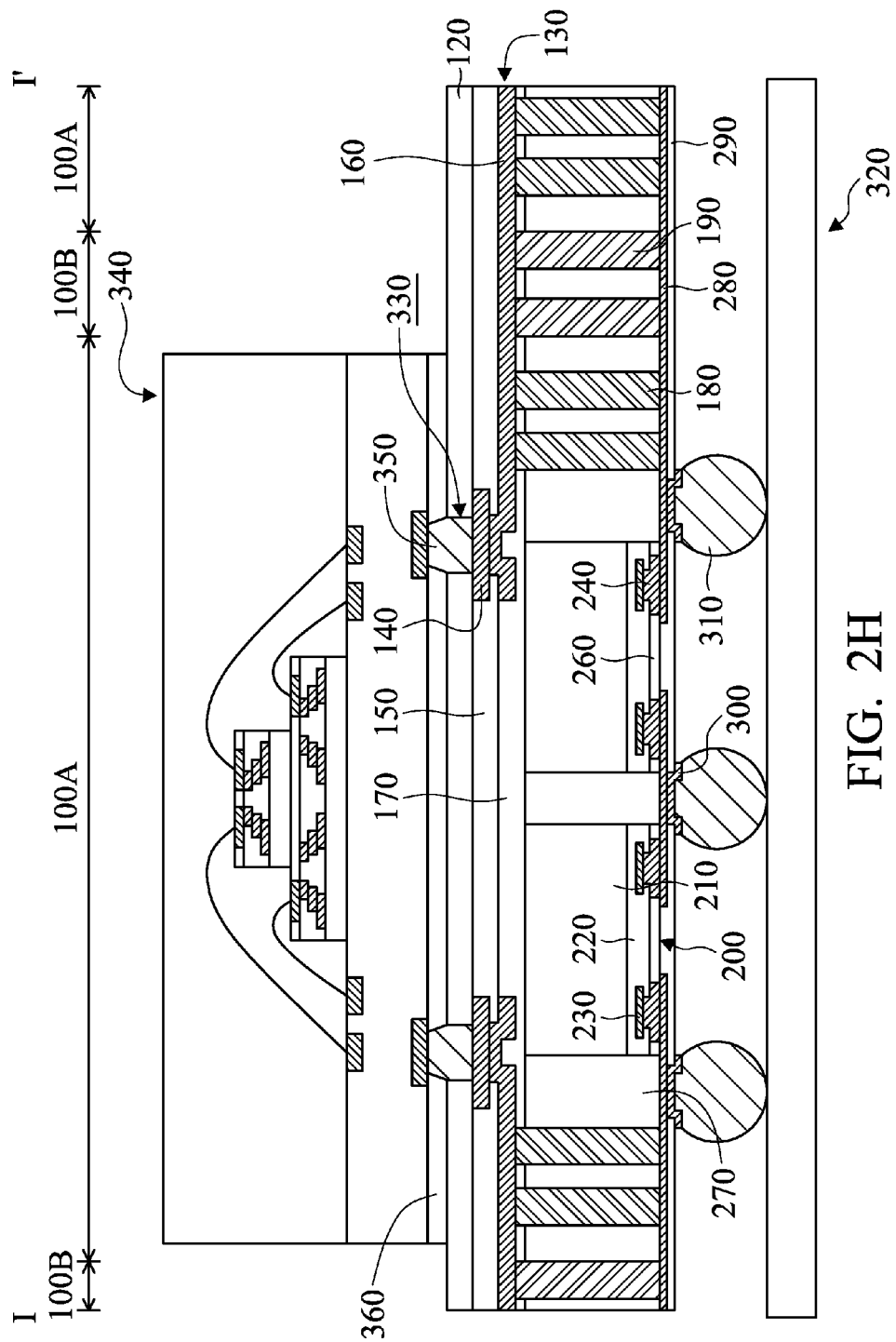

As shown in FIG. 2H, multiple portions of the base layer 120 are removed to form openings 330 in the regions 100A, in accordance with some embodiments. The openings 330 expose portions of the redistribution structure 130, such as portions of the conductive layer 140. In some embodiments, a laser drilling process is performed to form the openings 330. Another applicable process, such as an etching process, may also be used to form the openings 330.

Afterwards, one or more elements 340 are stacked over the structure as shown in FIG. 2G, in accordance with some embodiments. The elements 340 and the integrated circuit dies 200 are on two opposite sides of the base layer 120. In some embodiments, each of the elements 340 includes a package structure that contains one or more integrated circuit dies. However, embodiments of the disclosure are not limited thereto. In some other embodiments, each of the elements 340 includes an integrated circuit die. The elements 340 can be varied according to requirements.

In some embodiments, one or more connectors 350 are used to achieve the bonding between the elements 340 and the redistribution structure 130, as shown in FIG. 2H. The connectors 350 include solder bumps, metal pillars, other suitable connectors, or a combination thereof.

Afterwards, an underfill layer 360 is deposited between the base layer 120 and one of the elements 340, in accordance with some embodiments. In some embodiments, the underfill layer 360 fills a space between the base layer 120 and one of the elements 340 in the regions 100A. The underfill layer 360 is a liquid epoxy, deformable gel, silicon rubber, another suitable material, or a combination thereof. In some embodiments, a dispensing process is performed to form the underfill layer 360.

Figure 2I:
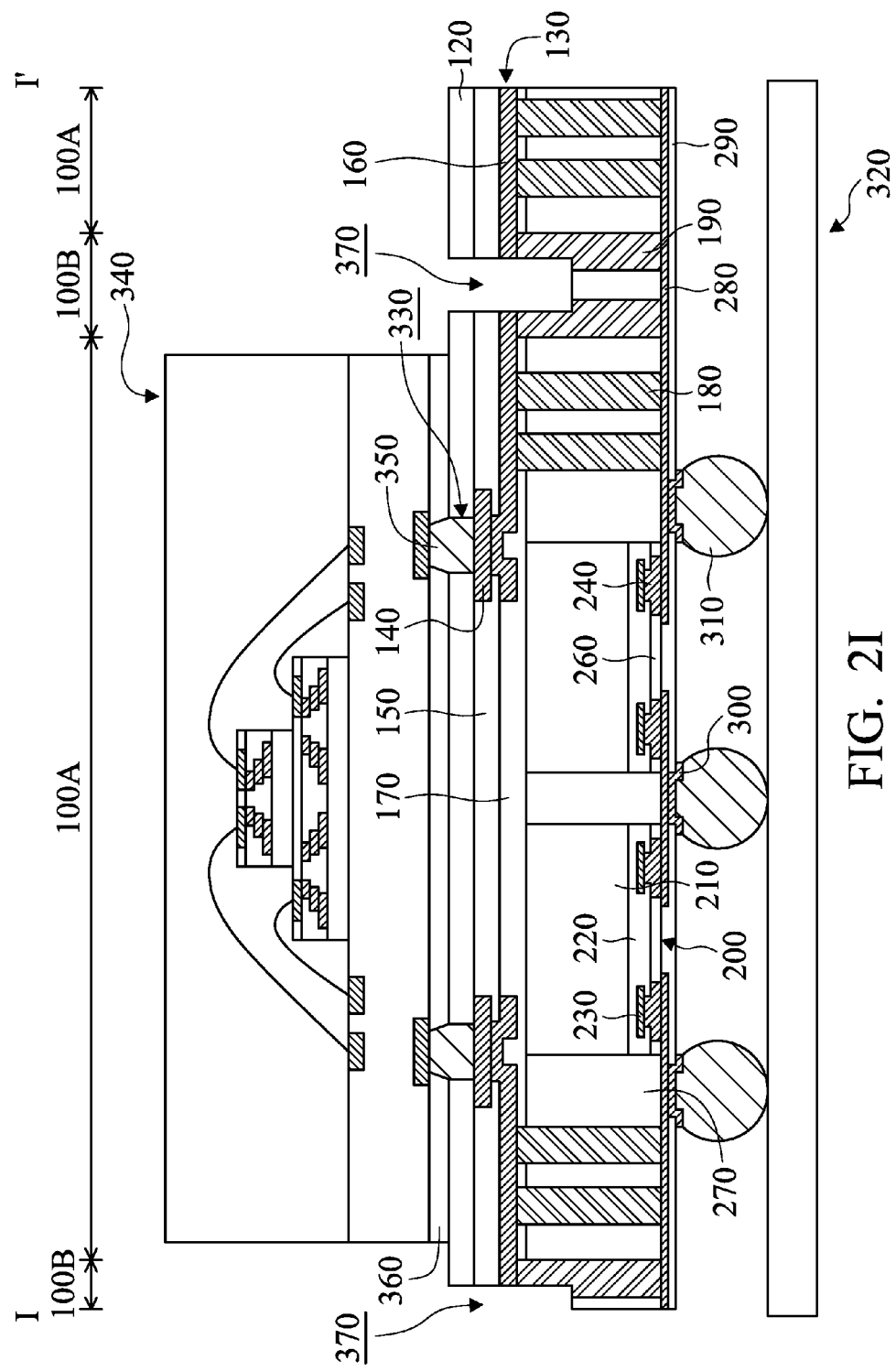

As shown in FIG. 2I, an opening 370 is formed in the region 100B, in accordance with some embodiments. The opening 370 vertically extends from the base layer 120 into the redistribution structure 130. In some embodiments, the opening 370 penetrates through the redistribution structure 130 and further extends into the package layer 270. As a result, one or more of the shielding features 190 in the package layer 270 are partially exposed.

In some embodiments, the package layer 270 is partially removed during the formation of the opening 370. In some embodiments, one or more of the shielding features 190 are partially removed during the formation of the opening 370.

Many variations and/or modifications can be made to embodiments of the disclosure. In some other embodiments, the opening 370 penetrates through the redistribution structure 130 without extending into the package layer 270. The top surface of one or more of the shielding features 190 is completely or partially exposed from the opening 370. In some other embodiments, the opening 370 partially exposes the conductive layer 140 or 160 without penetrating through the redistribution structure 130. Alternatively, the opening 370 may penetrate through the package layer 270. As a result, the conductive layer 280 is partially exposed.

The opening 370 laterally extends along the scribe line in the region 100B. In some embodiments, the opening 370 in the region 100B continuously surrounds the regions 100A. In some embodiments, the opening 370 in the region 100B continuously surrounds the integrated circuit dies 200. In some embodiments, a dicing process is performed to form the opening 370. Another applicable process, such as a laser drilling process, may also be used to form the opening 370.

Figure 2J:
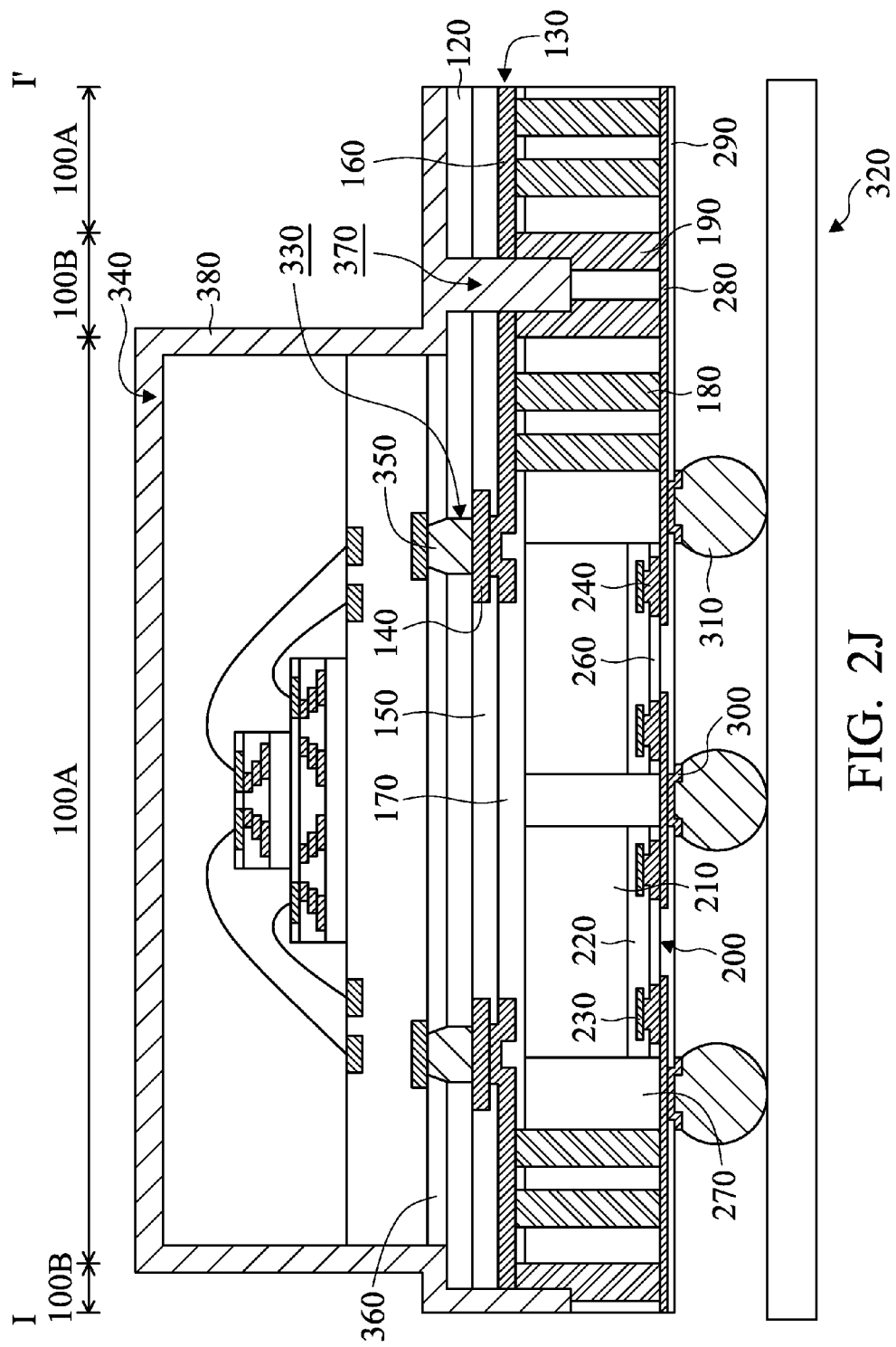

As shown in FIG. 2J, a shielding feature 380 is deposited in the regions 100A and the region 100B, in accordance with some embodiments. The shielding feature 380 covers the base layer 120 and the elements 340. In some embodiments, the top surface and the sidewalls of the elements 340 are substantially completely encircled by the shielding feature 380. In some embodiments, the shielding feature 380 extends into the opening 370 and completely fills the opening 370. In some other embodiments, the shielding feature 380 conformally extends into the opening 370 and partially fills the opening 370. As a result, the shielding feature 380 is electrically connected to the shielding features 190.

In some embodiments, the shielding feature 380 partially laterally overlaps the shielding features 190. In some embodiments, the shielding feature 380 is in direct contact with the shielding features 190. In some embodiments, an interface between one of the shielding features 190 and the shielding feature 380 is observed using a suitable spectrometer or electron microscope. In some embodiments, the shielding feature 380 is in direct contact with the package layer 270.

In some embodiments, the shielding feature 380 includes Cu, Al, another suitable conductive material, or a combination thereof. In some embodiments, the shielding feature 380 and the shielding features 190 are made of the same material. However, embodiments of the disclosure are not limited thereto. In some other embodiments, the shielding feature 380 and the shielding features 190 are made of different materials. In some embodiments, the shielding feature 380 is formed by a sputtering process, an electroplating process, an electroless plating process, a CVD process, or another applicable process.

Afterwards, a singulation process is performed to separate the structure as shown in FIG. 2J into multiple package structures, in accordance with some embodiments. In some embodiments, a dicing process is performed along the scribe line in the region 100B. As a result, the package structures are formed in the regions 100A and are separated from one another. The carrier 320 is removed. One of the package structures is shown in FIG. 2K.

In some embodiments, the shielding feature 380 and the package layer 270 are diced along the opening 370 or the scribe line in the region 100B. In some embodiments, the shielding features 190, the shielding feature 380 and the package layer 270 are diced along the opening 370 or the scribe line in the region 100B.

Figure 2K:
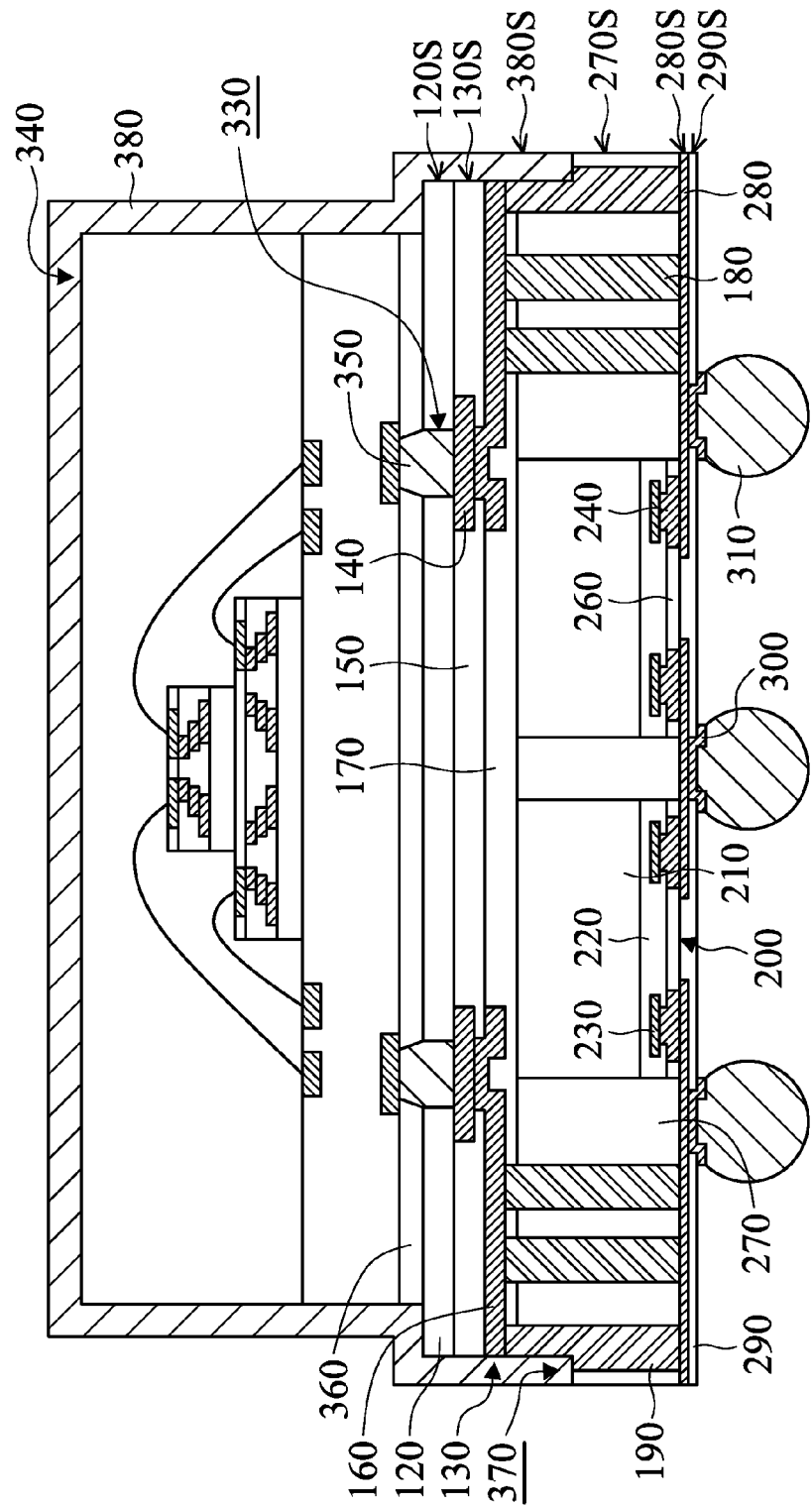

As shown in FIG. 2K, the shielding feature 380 extends from a side surface 120S of the base layer 120 towards the shielding features 190 to electrically connect to the shielding features 190. In some embodiments, a side surface 380S of the shielding feature 380 faces away from the side surface 120S. The side surface 380S is substantially coplanar with a side surface 270S of the package layer 270. In some embodiments, the side surface 380S is non-coplanar with a side surface 130S of the redistribution structure 130.

In some embodiments, the side surface 380S is substantially coplanar with a side surface of the redistribution structure including the conductive layer 280 and the passivation layer 290. For example, the side surface 380S is substantially coplanar with the side surface 290S of the passivation layer 290, as shown in FIG. 2K. In some embodiments, the side surface 380S is substantially coplanar with the side surface 280S of the conductive layer 280.

In some embodiments, the shielding feature 380 is separated from the conductive layer 280 by the package layer 270. In some embodiments, the shielding feature 380 is separated from the conductive layer 280 by one of the shielding features 190.

An upper portion of one of the shielding features 190 is sandwiched between the package layer 270 and the shielding feature 380, as shown in FIG. 2K in accordance with some embodiments. A lower portion of one of the shielding features 190 is embedded in the package layer 270.

According to some embodiments of the disclosure, the shielding feature 380, the conductive layer 280, and the shielding features 190 together surround top and bottom surfaces and sidewalls of the package structure, as shown in FIG. 2K. As a result, an anti-electromagnetic interference feature is formed. Accordingly, electromagnetic interference issues are greatly mitigated or eliminated. Therefore, device performance and reliability of the package structure are improved.

The shielding features 190 and the shielding feature 380 of the anti-electromagnetic interference feature are formed or deposited before the dicing process. In other words, the shielding features 190 and the shielding feature 380 are formed or deposited during wafer level packaging processes. As a result, multiple package structures with an anti-electromagnetic interference feature are formed in the same stage. Accordingly, the cost and the fabrication time are reduced significantly. Embodiments of the disclosure provide a more simplified and faster packaging process.

In accordance with some embodiments, the shielding features 190 are formed before the formation of the connectors 310, and the shielding feature 380 is deposited before the dicing process. The shielding features 190 are separated from the connectors 310 by the passivation layer 290. The shielding feature 380 is separated from the connectors 310 by the passivation layer 290, the shielding features 190, and the package layer 270. As a result, the conductive materials of the anti-electromagnetic interference feature are prevented from being deposited over the passivation layer 290 and/or the connectors 310. Short-circuit issues are inhibited. Therefore, reliability of the package structure is enhanced.

Many variations and/or modifications can be made to embodiments of the disclosure. For example, although the embodiments shown in FIGS. 2A-2K provide a package structure having a "fan-out" feature, embodiments of the disclosure are not limited thereto. Some other embodiments of the disclosure include package structures having a "fan-in" feature.

Figure 5:
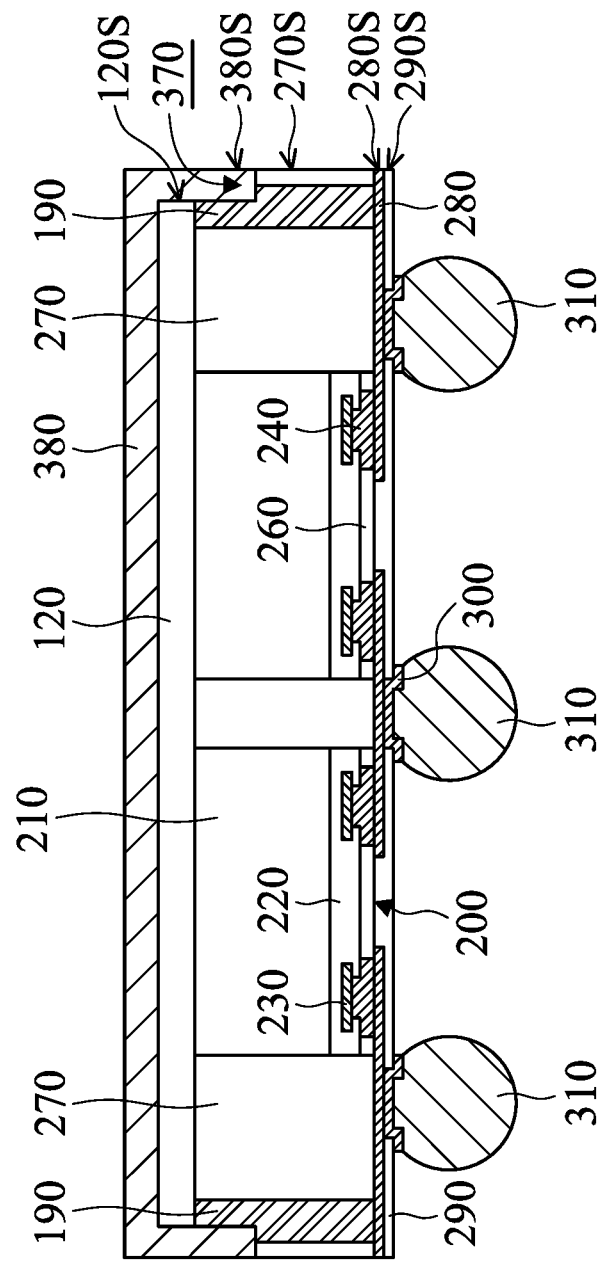
FIG. 5 is a cross-sectional view of a package structure, in accordance with some embodiments.

Many variations and/or modifications can be made to embodiments of the disclosure. For example, although the embodiments shown in FIGS. 2A-2K provide a package on package (PoP) structure, embodiments of the disclosure are not limited thereto. FIG. 5 is a cross-sectional view of a package structure, in accordance with some embodiments. As shown in FIG. 5, there is not another package structure or integrated circuit die stacked over the integrated circuit dies 200.

In some embodiments, there is no redistribution structure between the integrated circuit dies 200 and the base layer 120 in the package structure shown in FIG. 5. In some embodiments, there is no conductive feature between the integrated circuit dies 200 and the shielding features 190 in the package structure shown in FIG. 5.

In some embodiments, the opening 370 penetrates through the base layer 120 and further extends into the package layer 270. As a result, one or more of the shielding features 190 are partially exposed. In some embodiments, the shielding feature 380 covers the base layer 120 and completely or partially fills the opening 370. In some embodiments, the shielding feature 380 is in direct contact with the base layer 120, the shielding features 190, and the package layer 270.

Embodiments of the disclosure provide a package structure and methods for forming the same. The package structure includes a first shielding feature and a second shielding feature that together form an anti-electromagnetic interference feature. As a result, electromagnetic interference issues are greatly mitigated or eliminated. Therefore, device performance and reliability of the package structure are improved.

A package layer encapsulates the first shielding feature and an integrated circuit die surrounded by the first shielding feature. An opening is formed to expose the first shielding feature. The second shielding feature covers the integrated circuit die and the package layer, and extends into the opening to electrically connect to the exposed first shielding feature. As a result, the first shielding feature and the second shielding feature together surround the top surface and the sidewalls of each package structure. The first shielding feature and the second shielding feature are formed during wafer level packaging processes. Accordingly, the cost and the fabrication time of package structures are reduced significantly.

In accordance with some embodiments, a package structure is provided. The package structure includes an integrated circuit die and a first shielding feature over a base layer. The package structure also includes a package layer encapsulating the integrated circuit die and the first shielding feature. The package structure further includes a second shielding feature extending from the side surface of the base layer towards the first shielding feature to electrically connect to the first shielding feature. The side surface of the second shielding feature faces away from the side surface of the base layer and is substantially coplanar with the side surface of the package layer.

In accordance with some embodiments, a package structure is provided. The package structure includes an integrated circuit die encapsulated by a package layer. The package structure also includes a first shielding feature penetrating through the package layer. The package structure further includes a second shielding feature covering the integrated circuit die and the package layer. The second shielding feature extends towards the first shielding feature to electrically connect to the first shielding feature. In addition, the package structure includes a redistribution structure electrically connected to the first shielding feature. The second shielding feature is separated from the redistribution structure by the first shielding feature.

In accordance with some embodiments, a method for forming a package structure is provided. The method includes forming a first shielding feature over a base layer. The method also includes disposing an integrated circuit die over the base layer. The method further includes forming a package layer over the base layer to encapsulate the first shielding feature and the integrated circuit die. In addition, the method includes forming an opening penetrating through the base layer. The method also includes forming a second shielding feature covering the integrated circuit die and the package layer. The second shielding feature extends into the opening to electrically connect to the first shielding feature in the package layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   an integrated circuit die and a first shielding feature over a front surface of a base layer;
   a package layer encapsulating the integrated circuit die and the first shielding feature; and
   a second shielding feature extending from a back surface of the base layer along a side surface of the base layer towards the first shielding feature to electrically connect to the first shielding feature, wherein the second shielding feature has a corner surrounded by the first shielding feature.

2. The package structure as claimed in claim 1, wherein the second shielding feature is in direct contact with the corner of the first shielding feature in the package layer.

3. The package structure as claimed in claim 1, wherein the second shielding feature partially laterally overlaps the first shielding feature and the integrated circuit die.

4. The package structure as claimed in claim 1, further comprising a redistribution structure over the first shielding feature, wherein the second shielding feature has a side surface opposite to the side surface of the base layer, and the side surface of the second shielding feature is substantially coplanar with a side surface of the redistribution structure and a side surface of the package layer.

5. The package structure as claimed in claim 1, further comprising a redistribution structure over the first shielding feature and the package layer, wherein a distance between the second shielding feature and the redistribution structure is less than a thickness of the package layer.

6. The package structure as claimed in claim 1, further comprising a redistribution structure between the first shielding feature and the base layer, wherein the second shielding feature has a side surface opposite to the side surface of the base layer, and the side surface of the second shielding feature is non-coplanar with a side surface of the redistribution structure.

7. The package structure as claimed in claim 1, further comprising one or more conductive features encapsulated by the package layer and between the first shielding feature and the integrated circuit die.

8. The package structure as claimed in claim 1, further comprising a second integrated circuit die stacked over the integrated circuit die and the package layer, wherein the second shielding feature further extends to surround the second integrated circuit die.

9. A package structure, comprising:
   an integrated circuit die encapsulated by a package layer;
   a first shielding feature penetrating through the package layer;
   a second shielding feature covering the integrated circuit die and the package layer, wherein the second shielding feature extends towards the first shielding feature to electrically connect to the first shielding feature, and the second shielding feature has a corner surrounded by the first shielding feature; and
   a redistribution structure electrically connected to the first shielding feature, wherein a portion of the first shielding feature is sandwiched between the redistribution structure and the second shielding feature such that the second shielding feature is separated from the redistribution structure.

10. The package structure as claimed in claim 9, wherein a portion of the package layer is sandwiched between the redistribution structure and the second shielding feature such that the second shielding feature is further separated from the redistribution structure.

11. The package structure as claimed in claim 9, wherein the portion of the first shielding feature sandwiched between the redistribution structure and the second shielding feature is thinner than the package layer.

12. The package structure as claimed in claim 9, further comprising:
    a conductive feature encapsulated by the package layer and between the first shielding feature and the integrated circuit die; and
    a connecting feature between the conductive feature and the first shielding feature, wherein the first shielding feature is electrically connected to the conductive feature through the connecting feature.

13. The package structure as claimed in claim 9, further comprising conductive features encapsulated by the package layer and between the first shielding feature and the integrated circuit die, wherein the first shielding feature laterally overlaps more than one of the conductive features.

14. A method for forming a package structure, comprising:
    forming a first shielding feature over a front surface of a base layer;
    disposing an integrated circuit die over the front surface of the base layer;
    forming a package layer over the front surface of the base layer to encapsulate the first shielding feature and the integrated circuit die;
    forming an opening penetrating through the base layer and extending into the package layer so that a bottom surface of the opening is within the package layer; and
    forming a second shielding feature covering the integrated circuit die and the package layer, wherein the second shielding feature extends from a back surface of the base layer into the opening to electrically connect to the first shielding feature in the package layer.

15. The method for forming a package structure as claimed in claim 14, further comprising forming a redistribution structure over the base layer before the formation of the first shielding feature, wherein the opening further penetrates through the redistribution structure.

16. The method for forming a package structure as claimed in claim 14, further comprising forming one or more conductive features over the base layer during the formation of the first shielding feature, wherein the one or more conductive features are encapsulated by the package layer.

17. The method for forming a package structure as claimed in claim 14, further comprising stacking a second integrated circuit die before the formation of the opening, wherein the second integrated circuit die and the integrated circuit die are on two opposite sides of the base layer, and the second integrated circuit die is surrounded by the second shielding feature.

18. The method for forming a package structure as claimed in claim 14, wherein the first shielding feature and the package layer are partially removed during the formation of the opening such that the opening extends into the first shielding feature and the package layer.

19. The method for forming a package structure as claimed in claim 14, further comprising dicing the second shielding feature along the opening.

20. The method for forming a package structure as claimed in claim 16, further comprising dicing the first shielding feature during the formation of the opening, wherein the one or more conductive features between the first shielding feature and the integrated circuit die are not cut during the formation of the opening.

* * * * *